(12) United States Patent
Taniike

(10) Patent No.: US 11,942,308 B2
(45) Date of Patent: Mar. 26, 2024

(54) MICROWAVE PLASMA SOURCE, MICROWAVE PLASMA PROCESSING APPARATUS AND PLASMA PROCESSING METHOD

(71) Applicant: TOKYO ELECTRON LIMITED, Tokyo (JP)

(72) Inventor: Yasuaki Taniike, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 416 days.

(21) Appl. No.: 17/229,122

(22) Filed: Apr. 13, 2021

(65) Prior Publication Data

US 2021/0233742 A1 Jul. 29, 2021

Related U.S. Application Data

(62) Division of application No. 15/882,028, filed on Jan. 29, 2018, now Pat. No. 11,056,317.

(30) Foreign Application Priority Data

Jan. 31, 2017 (JP) .................................. 2017-015089

(51) Int. Cl.
*H01J 37/32* (2006.01)
*C23C 16/34* (2006.01)
(Continued)

(52) U.S. Cl.
CPC ........ *H01J 37/3222* (2013.01); *C23C 16/345* (2013.01); *C23C 16/45542* (2013.01);
(Continued)

(58) Field of Classification Search
CPC ................. C23C 16/511; C23C 16/345; C23C 16/45542; C23C 16/4584;
(Continued)

(56) References Cited

U.S. PATENT DOCUMENTS

| 5,874,012 | A | 2/1999 | Kanai et al. |
| 2008/0067146 | A1 | 3/2008 | Onishi et al. |
| 2009/0314629 | A1 | 12/2009 | Nishimoto |
| 2010/0101728 | A1 | 4/2010 | Iwasaki |

(Continued)

FOREIGN PATENT DOCUMENTS

| JP | 2000294550 A | 10/2000 |
| JP | 2003-338400 A | 11/2003 |

(Continued)

*Primary Examiner* — Yuechuan Yu
(74) *Attorney, Agent, or Firm* — Nath, Goldberg & Meyer; Jerald L. Meyer; Tanya E. Harkins

(57) ABSTRACT

A microwave plasma source that generates a microwave plasma in a processing space in which a target substrate is processed, includes: a microwave generation part for generating microwave; a waveguide through which the microwave generated by the microwave generation part propagates; an antenna part including a slot antenna having a predetermined pattern of slots formed therein and being configured to radiate the microwave propagating through the waveguide into the processing space and a microwave-transmitting plate being made of a dielectric material and being configured to transmit the microwave radiated from the slots therethrough and supply the microwave into the processing space; a temperature detector for detecting a temperature at a predetermined position in a microwave propagation path leading to the slot antenna; and an abnormality detection part for receiving the temperature detected by the temperature detector and detect an abnormality in the microwave propagation path based on the detected temperature.

5 Claims, 6 Drawing Sheets

(51) Int. Cl.
  *C23C 16/455* (2006.01)
  *C23C 16/458* (2006.01)
  *C23C 16/511* (2006.01)
  *H01L 21/02* (2006.01)
  *H01L 21/66* (2006.01)

(52) U.S. Cl.
  CPC .... *C23C 16/45551* (2013.01); *C23C 16/4584* (2013.01); *C23C 16/511* (2013.01); *H01J 37/32311* (2013.01); *H01L 21/02274* (2013.01); *H01L 21/0228* (2013.01); *H01L 22/34* (2013.01)

(58) Field of Classification Search
  CPC .......... C23C 16/45551; H01J 37/32311; H01J 37/3222; H01L 21/02274; H01L 21/0228; H01L 22/34
  See application file for complete search history.

(56) References Cited

U.S. PATENT DOCUMENTS

| | | | |
|---|---|---|---|
| 2011/0139070 A1* | 6/2011 | Nabeta | C23C 16/458 118/712 |
| 2011/0168673 A1* | 7/2011 | Nishimoto | H01J 37/32192 118/723 AN |
| 2012/0192953 A1 | 8/2012 | Matsushima | |
| 2012/0267048 A1* | 10/2012 | Moyama | H01J 37/32229 156/345.33 |

FOREIGN PATENT DOCUMENTS

| | | |
|---|---|---|
| JP | 2008-091218 A | 4/2008 |
| JP | 2008-251660 A | 10/2008 |
| JP | 2010-3462 A | 1/2010 |
| JP | 2013171847 A | 9/2013 |
| JP | 2016115814 A | 6/2016 |
| KR | 10-2016-0147669 A | 12/2016 |

* cited by examiner

MICROWAVE PLASMA SOURCE, MICROWAVE PLASMA PROCESSING APPARATUS AND PLASMA PROCESSING METHOD

This is a Divisional Application of U.S. patent application Ser. No. 15/882,028, filed Jan. 29, 2018, an application claiming benefit from Japanese Patent Application No. 2017-015089, filed on Jan. 31, 2017, the entire contents of each of which are incorporated herein by reference.

TECHNICAL FIELD

The present disclosure relates to a microwave plasma source, a microwave plasma processing apparatus and a plasma processing method.

BACKGROUND

Plasma processing is an indispensable technology for manufacturing semiconductor devices. In recent years, an increasing number of highly-integrated and faster Large Scale Integrated (LSI) circuits are in demand, and thus the design rule for semiconductor devices constituting LSIs is becoming more miniaturized and semiconductor wafers are becoming larger in size. As such, there is a need for a plasma processing apparatus to cope with such miniaturization and increasing size.

A parallel plate type or inductively coupled type plasma processing apparatus has been conventionally used as a plasma processing apparatus, but there is difficulty in treating large-sized wafers with plasma uniformly and at high speed.

In this connection, an RLSA® microwave plasma processing apparatus which is capable of uniformly forming surface wave plasma with low electron temperature and high density is attracting attention.

The RLSA® microwave plasma processing apparatus includes a planar slot antenna having a plurality of slots formed therein with a predetermined pattern, which is installed above a chamber. In this apparatus, a microwave guided from a microwave generator is guided to the slot antenna through a slow-wave member made of a dielectric material and is radiated from the slots of the slot antenna. The microwave is transmitted through a ceiling wall of the chamber made of a dielectric material into the chamber kept at a vacuum, to thereby generate surface wave plasma inside the chamber. This plasma is used to plasmarize a gas introduced into the chamber and process a workpiece such as a semiconductor wafer.

There has also been proposed a plasma processing apparatus in which a plurality of microwaves is distributed, a plurality of microwave radiation parts each having a planar slot antenna, which is the microwave radiating antenna as described above, is installed, and the microwaves radiated from the slot antenna are guided into a chamber and are spatially combined inside the chamber to generate plasma.

In such a microwave plasma apparatus, if a plasma ignition failure occurs, the process cannot be properly performed. Further, if abnormal discharge occurs at a connection portion of members of a microwave propagation path, the members may be damaged. Thus, there is a need for safety measures to detect an ignition failure.

As an example of such safety measures, there are mainly used a technique for monitoring a threshold value of a parameter (for example, a ratio of a reflection wave to a travelling wave, a position of a tuner that performs imped- ance matching, etc.) detected and adjusted inside a microwave plasma source and cutting off microwave power when abnormal reflection or the like occurs, or a technique for sensing the interior of a chamber with a light emitting sensor (light quantity or color tone sensor), checking plasma ignition at the time of microwave power ON and cutting off microwave power as in the former technique when ignition is not properly performed.

On the other hand, the RLSA® microwave plasma processing apparatus is used in a semi-batch type film forming apparatus in which a plurality of semiconductor wafers is mounted on a rotary table disposed inside a vacuum container and the wafers alternately pass through a region to which a precursor gas is supplied and a region to which plasma of a reaction gas is supplied, with the rotation of the rotary table, thereby forming films on the wafers by an atomic layer deposition (ALD). Specifically, a circular space defined above the rotary table is divided into a first region to which a raw material gas (precursor) is supplied and a second region defined to be wider than the first region and to which plasma of a reaction gas is supplied. Three microwave plasma processing units (microwave plasma processing apparatuses) for plasmarizing or reducing the reaction gas are provided in the second region. Thus, for example, when forming a nitride film such as a SiN film, it is possible to promote nitridation and form a high-quality film.

However, in the case of the conventional film forming apparatus, since the three microwave plasma processing units are installed adjacent to each other, there is a concern that a plasma light emitting sensor of one of the units may erroneously detect emission of plasma generated in another unit and it is difficult to install a light emitting sensor due to the restricted space. Furthermore, the film forming apparatus uses a carbon wire heater that emits infrared rays, as a heater for heating the wafers, in order to efficiently heat the wafers in a narrow space. Thus, it is difficult to detect the emission of plasma even when a light emitting sensor can be installed.

Therefore, the microwave units (microwave plasma processing apparatuses) used for the conventional film forming apparatus take safety measures to detect an ignition failure only with monitoring of a threshold value of a parameter detected and adjusted inside the microwave units, instead of using a light emitting sensor.

However, when no light emitting sensor is used and only the monitoring of the threshold value is performed, there may be a case in which, when unexpected matching occurs inside an antenna part or micro-discharge occurs in a microwave propagation path leading to a slow antenna, an abnormality does not appear in a parameter detected and adjusted inside the microwave units, which makes it difficult to find an ignition failure beforehand. Thus, it is difficult to find a sudden ignition failure caused at the time of plasma ignition, which makes it difficult to sufficiently prevent damage to members constituting an antenna part, damage to wafers being processed, and downtime for restoring the apparatuses.

SUMMARY

Some embodiments of the present disclosure provide a technology capable of reliably detecting an indication of ignition failure of microwave plasma, thereby preventing the ignition failure in advance.

According to one embodiment of the present disclosure, there is provided a microwave plasma source that generates a microwave plasma in a processing space in which a target substrate is processed, including: a microwave generation part configured to generate a microwave; a waveguide through which the microwave generated by the microwave generation part propagates; an antenna part including a slot antenna and a microwave-transmitting plate, the slot antenna having a predetermined pattern of slots formed therein and being configured to radiate the microwave propagating through the waveguide into the processing space, and the microwave-transmitting plate being made of a dielectric material and being configured to transmit the microwave radiated from the slots therethrough and supply the microwave into the processing space; a temperature detector configured to detect a temperature at a predetermined position in a microwave propagation path leading to the slot antenna; and an abnormality detection part configured to receive the temperature detected by the temperature detector and detect an abnormality in the microwave propagation path based on the detected temperature.

According to another embodiment of the present disclosure, there is provided a microwave plasma processing apparatus including: a processing container having a processing space defined therein and in which a target substrate is processed; a microwave generation part configured to generate a microwave; a waveguide configured to propagate the microwave generated by the microwave generation part therethrough; an antenna part including a slot antenna and a microwave-transmitting plate, the slot antenna having a predetermined pattern of slots formed therein and being configured to radiate the microwave propagating through the waveguide into the processing space, and the microwave-transmitting plate being made of a dielectric material and being configured to transmit the microwave radiated from the slots therethrough and supply the microwave into the processing space; a temperature detector configured to detect a temperature of a predetermined position in a microwave propagation path leading to the slot antenna; an abnormality detection part configured to receive the temperature detected by the temperature detector and detect an abnormality in the microwave propagation path based on the detected temperature; a gas supply mechanism configured to supply a plasma processing gas into the processing space; and an exhaust mechanism configured to exhaust the processing space.

According to another embodiment of the present disclosure, there is provided a plasma processing method for performing a plasma process by a microwave plasma processing apparatus, wherein the microwave plasma processing apparatus includes: a processing container having a processing space defined therein and in which a target substrate is processed; a microwave generation part configured to generate a microwave; a waveguide configured to propagate the microwave generated by the microwave generation part therethrough; an antenna part including a slot antenna and a microwave-transmitting plate, the slot antenna having a predetermined pattern of slots formed therein and being configured to radiate the microwave propagating through the waveguide into the processing space, and the microwave-transmitting plate being made of a dielectric material and being configured to transmit the microwave radiated from the slots therethrough and supply the microwave into the processing space; a gas supply mechanism configured to supply a plasma processing gas into the processing space; and an exhaust mechanism configured to exhaust the processing space, the method including: when a microwave plasma is generated by radiating the microwave into the processing space via the waveguide and the antenna part while supplying the plasma processing gas into the processing space, detecting a temperature at a predetermined position of a microwave propagation path leading to the slot antenna; and detecting an abnormality in the microwave propagation path based on the detected temperature.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Embodiments of the present disclosure will be described below with reference to the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Film Forming Apparatus to which Microwave Plasma Processing Apparatus is Applied>

First, an example of a film forming apparatus to which a microwave plasma processing apparatus according to an embodiment of the present disclosure is applied will be described.

The film forming apparatus is a PE-ALD apparatus which forms a predetermined film by a plasma enhanced atomic layer deposition (PE-ALD) of alternately supplying a precursor gas and a reaction gas and plasmarizing the reaction gas.

Figure 1:
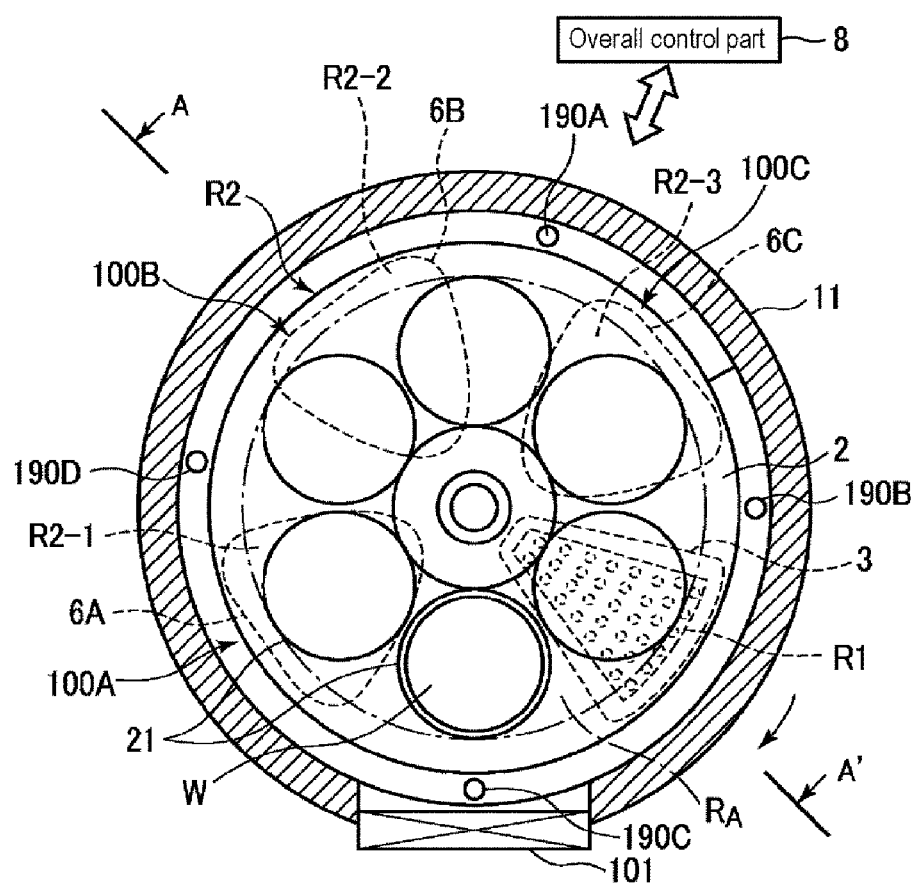
FIG. 1 is a cross-sectional view showing an example of a film forming apparatus to which a microwave plasma processing apparatus according to an embodiment of the present disclosure is applied.
Figure 2:
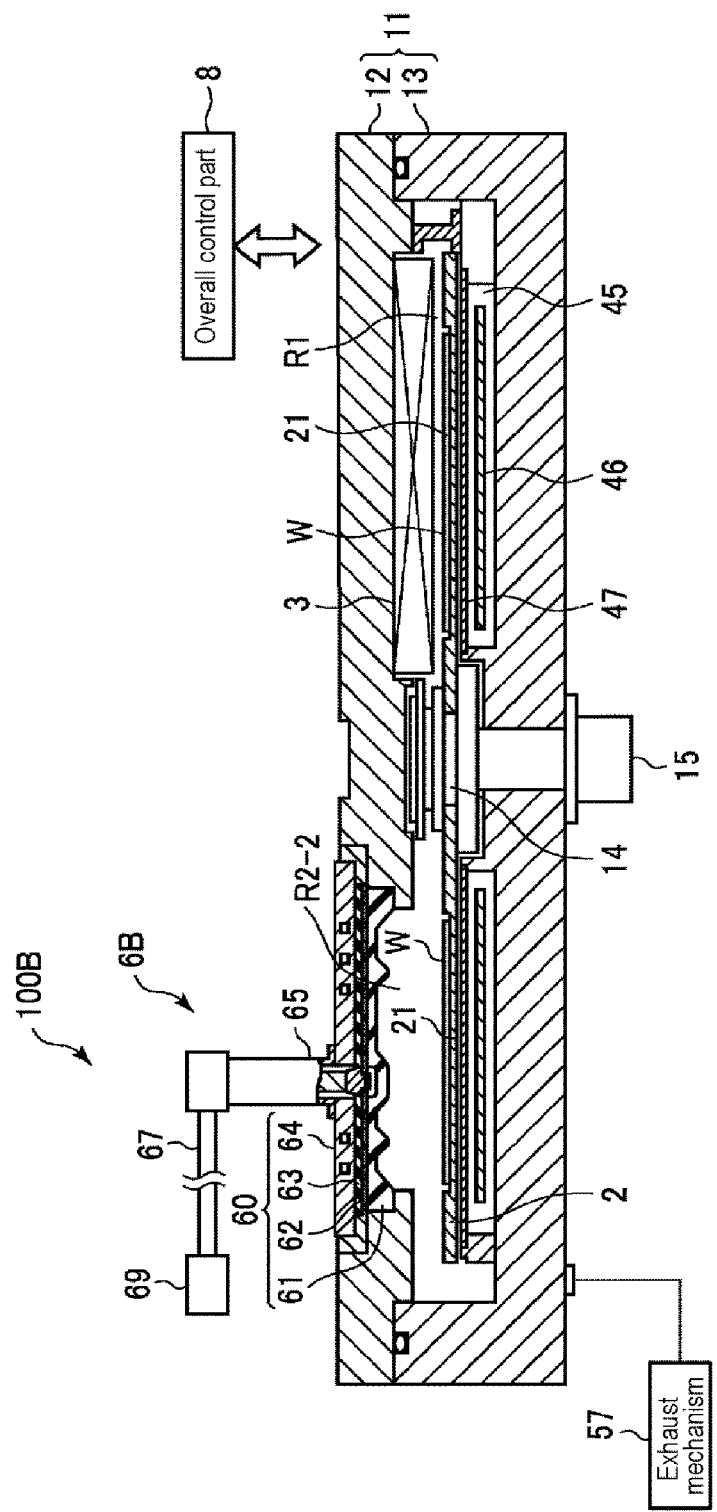
FIG. 2 is a longitudinal sectional view of the film forming apparatus of FIG. 1, taken along line A-A'.
Figure 3:
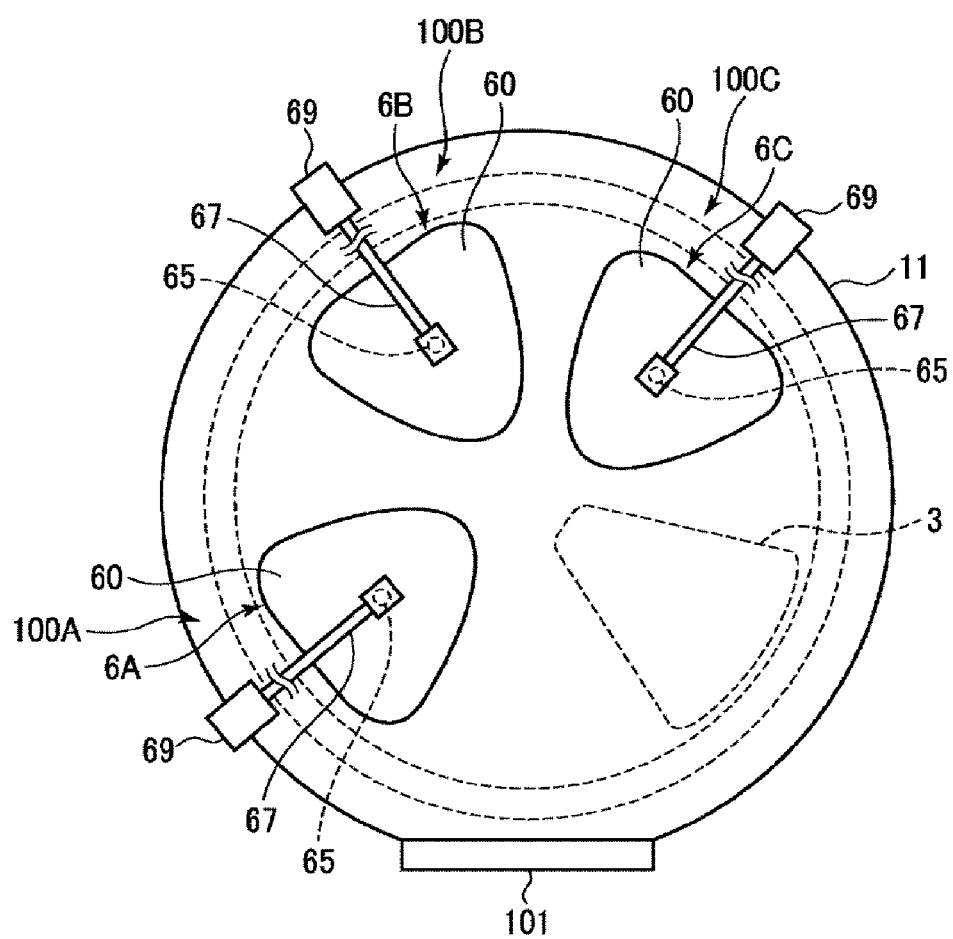
FIG. 3 is a plan view of the film forming apparatus of FIG. 1.

FIG. 1 is a transversal cross-sectional view of the film forming apparatus according to the present embodiment, FIG. 2 is a vertical cross-sectional view of the film forming apparatus of FIG. 1, taken along line A-A', and FIG. 3 is a plan view of the example film forming apparatus according to the present embodiment.

As shown in FIGS. 1 to 3, the film forming apparatus includes a processing container 11 which defines a processing chamber in which a film forming process is performed and which is kept at a vacuum. A rotary table 2 having a plurality of wafer mounting regions 21 formed therein is disposed inside the processing container 11. In a space defined above a portion of the processing container 11 through which the rotary table 2 passes, there are formed an adsorption region R1 in which a precursor gas, for example, a Si precursor gas such as dichlorosilane (DCS; $SiH_2Cl_2$), is adsorbed onto a wafer W, and a reaction region R2 in which a reaction process of reacting the precursor gas adsorbed onto the wafer W with a reaction gas to cause a predetermined reaction, for example, a nitridation process or reduction process, is performed.

A precursor gas introduction unit 3 for introducing the precursor gas into the adsorption region R1 is installed above the adsorption region R1 in the processing container 11. A precursor gas supply source (not shown) is connected to the precursor gas introduction unit 3 via a pipe. In addition, the precursor gas introduction unit 3 has an exhaust region (not shown) through which the precursor gas is exhausted and a separation gas supply region (not shown) through which a separation gas composed of an inert gas such as an Ar gas is supplied to separate the precursor gas from the reaction gas in the reaction region R2. The exhaust region and the separation gas supply region are formed at an outer peripheral portion of the precursor gas introduction unit 3.

Further, a processing gas for performing a plasma-based reaction process is supplied from a processing gas supply source (not shown in FIGS. 1 to 3) into the reaction region R2 via a pipe. Examples of the processing gas may include a plasma generation gas such as an Ar gas, and a reaction gas which reacts with the precursor gas, for example, a nitriding gas such as a $NH_3$ gas or a $N_2$ gas.

The reaction region R2 is divided into a first region R2-1, a second region R2-2 and a third region R2-3 in which microwave plasma processing apparatuses 100A, 100B and 100C are respectively installed. The microwave plasma processing apparatuses 100A, 100B and 100C include microwave plasma sources 6A, 6B, and 6C, respectively. The configuration of the microwave plasma processing apparatus 100B including the microwave plasma source 6B is shown in FIG. 2, which will be described in detail later.

As shown in FIG. 2, the processing container 11 is a substantially circular flat container composed of a container body 13 constituting a side wall and bottom portion of the processing container 11, and a ceiling plate 12 for air-tightly closing an opening formed in an upper surface of the container body 13. The processing container 11 is made of, for example, metal such as aluminum. An inner surface of the processing container 11 is subjected to a plasma-resistant process such as an anodizing process or ceramic thermal spray process.

A surface of the rotary table 2 is subjected to a plasma-resistant process as in the processing container 11. A rotary shaft 14 extending vertically downward is installed at the central portion of the rotary table 2. A rotation driving mechanism 15 for rotating the rotary table 2 is installed at the lower end of the rotary shaft 14.

As shown in FIG. 1, six wafer mounting regions 21 are formed in the upper surface of the rotary table 2 at regular intervals in the circumferential direction. Each of the wafer mounting regions 21 is configured as a circular recess having a diameter slightly larger than that of the wafer W. The number of wafer mounting regions 21 is not limited to six.

As shown in FIG. 2, an annular groove 45 is formed along the circumferential direction of the rotary table 2 in the bottom surface of the container body 13 positioned below the rotary table 2. A heater 46 is installed inside the annular groove 45 so as to correspond to the arrangement zone of the wafer mounting regions 21. The wafer W mounted on the rotary table 2 is heated to a predetermined temperature by the heater 46. For example, a carbon wire heater may be used as the heater 46. Further, an opening formed above the annular groove 45 is closed by a heater cover 47 which is an annular plate member.

As shown in FIGS. 1 and 3, a loading/unloading port 101 through which the wafer W is loaded and unloaded, is installed in the lateral wall surface of the processing container 11. The loading/unloading port 101 can be opened and closed by a gate valve. The wafer W held by an external transfer mechanism is loaded into the processing container 11 through the loading/unloading port 101.

In the rotary table 2 configured as above, when the rotary table 2 is rotated by the rotary shaft 14, each of the wafer mounting regions 21 revolves around the rotational center. At that time, the wafer mounting regions 21 pass through an annular revolution region $R_A$ indicated by a dash-dotted line.

As shown in FIG. 1, the film forming apparatus has an overall control part 8. The overall control unit 8 is configured to control respective components of the film forming apparatus, for example, the rotation driving mechanism 15 for rotating the rotary table 2, the precursor gas supply part, the separation gas supply part, the nitriding gas supply part, respective elements of a microwave generation part 69 of the microwave plasma sources 6A to 6C, and so on. The overall control part 8 includes a CPU (computer) and is composed of a main control part that controls overall functionality, an input device, an output device, a display device and a storage device. A storage medium which stores programs for controlling processes to be executed by the film forming apparatus, namely processing recipes, is set in the storage device. The main control part calls a predetermined processing recipe stored in the storage medium and controls the film forming apparatus to perform a predetermined process based on the called processing recipe.

<Microwave Plasma Processing Apparatus>

Next, the microwave plasma processing apparatuses in the reaction region R2 will be described.

As described above, the reaction region R2 has the first to third regions R2-1 to R2-3 where the microwave plasma processing apparatuses 100A, 100B and 100C having the respective microwave plasma sources 6A, 6B and 6C are respectively installed.

Figure 4:
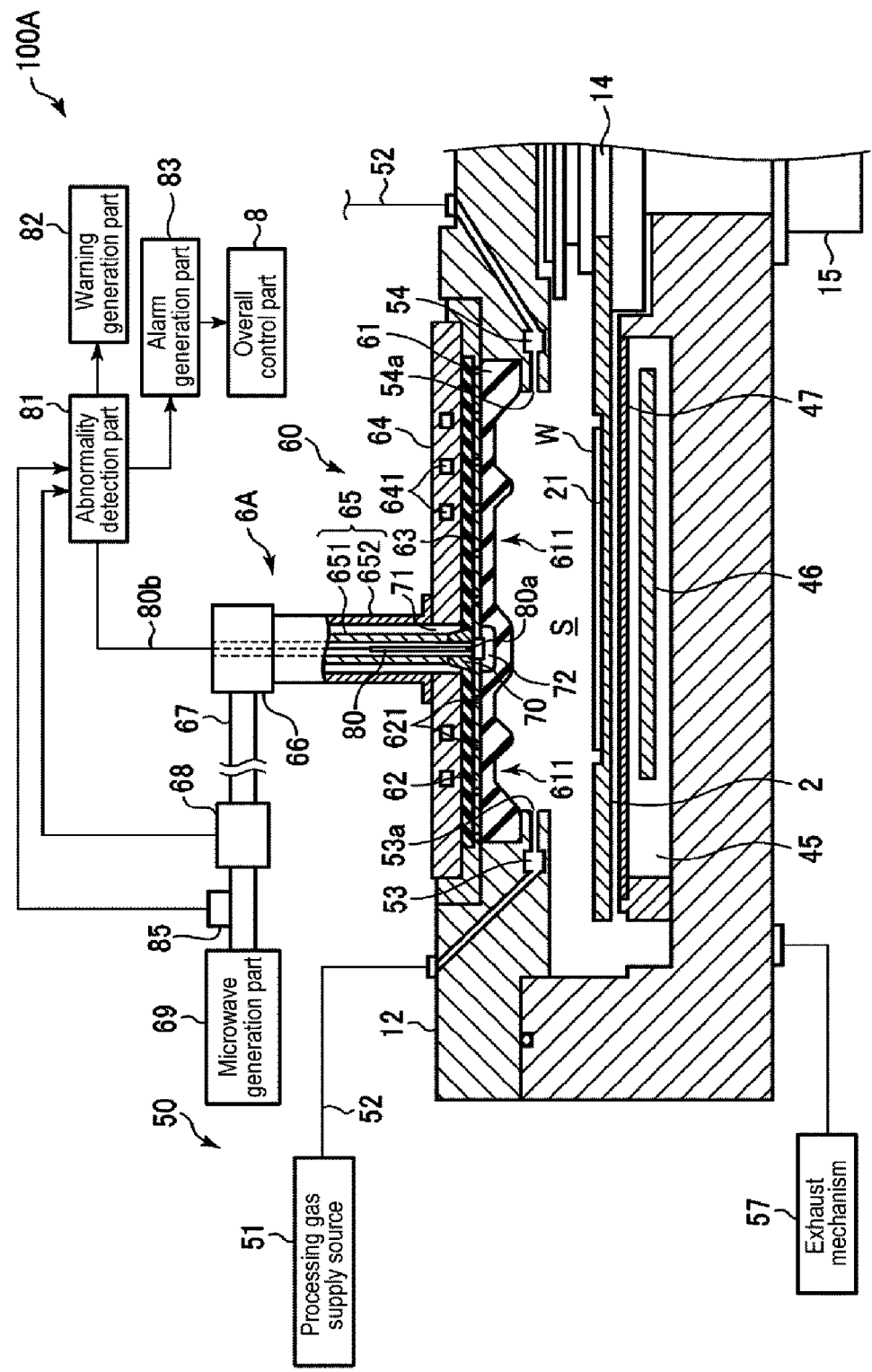
FIG. 4 is a cross-sectional view showing a microwave plasma processing apparatus according to an embodiment of the present disclosure.

FIG. 4 is a cross-sectional view showing the microwave plasma processing apparatus 100A. The microwave plasma processing apparatuses 100B and 100C are essentially identical in configuration with the microwave plasma processing apparatus 100A.

As shown in FIG. 4, the microwave plasma processing apparatus 100A includes the microwave plasma source 6A, a processing space S defined immediately under the microwave plasma source 6A inside the processing container 11, a processing gas supply mechanism 50 for supplying a processing gas into the processing space S, the above-described rotary table 2 as a support member for supporting the wafer W inside the processing space S, and an exhaust mechanism 57 for exhausting the interior of the processing space S. The wafer W mounted on the rotary table 2 passes through the processing space S.

The microwave plasma source 6A includes the microwave generation part 69, a waveguide 67 which propagates a microwave generated by the microwave generation part 69, a mode converter 66, a coaxial waveguide 65, and an antenna part 60 which receives the microwave propagating through the coaxial waveguide 65 and emits the microwave toward the processing space S. Therefore, the microwave plasma processing apparatus 100A is configured as an RLSA® microwave plasma processing apparatus. The antenna part 60 is provided so as to close a substantially triangular opening formed in the ceiling plate 12 which faces the upper surface of the rotary table 2.

The microwave generation part 69 includes an oscillator, a power supply and the like, and generates a microwave having a frequency of, for example, 2.45 GHz. One end of the waveguide 67 is connected to the microwave generation part 69 and the other end thereof is connected to the mode converter 66 which is a connection portion between the waveguide 67 and the coaxial waveguide 65. The coaxial waveguide 65 extends downward from the mode converter 66. The antenna part 60 is connected to a lower end of the coaxial waveguide 65. The frequency of the microwave generation part 69 is not limited to 2.45 GHz but may be various frequencies such as 8.35 GHz, 1.98 GHz, 860 MHz, 915 MHz, or the like.

The waveguide 67 has a rectangular sectional shape into which the microwave generated by the microwave generation part 69 propagates in a TE mode. In the mode converter 66, the vibration mode of the microwave is converted from the TE mode to a TEM mode. The microwave of the TEM mode propagates through the coaxial waveguide 65 and is guided to the antenna part 60.

A tuner 68 and a detector 85 composed of a directional coupler and the like is installed in the waveguide 67. The tuner 68 is used to match the impedance of plasma as an internal load of the processing space S with the characteristic impedance of the power supply of the microwave generation part 69. The detector 85 detects a traveling wave and a reflection wave.

The antenna part 60 includes a microwave-transmitting plate 61, a slot antenna 62, a slow-wave member 63 and a cooling jacket 64 having a shielding function and through which a cooling medium such as ethylene glycol flows from a chiller unit.

The coaxial waveguide 65 has an inner conductor 651 and an outer conductor 652 installed in a coaxial relationship with the inner conductor 651. The inner conductor 651 has a water cooling path. The coaxial waveguide 65 is cooled by water flowing through the water cooling path of the inner conductor 651 and the cooling medium such as ethylene glycol flowing through the cooling jacket 64. The inner conductor 651 is inserted into a hole portion 71 extending from the upper portion of the cooling jacket 64 of the antenna part 60 to the slot antenna 62 and is connected to the slot antenna 62 via a connector 70. A lower portion of the connector is covered with a cap 72. The outer conductor 652 is attached to the cooling jacket 64.

The slot antenna 62 is formed of a substantially triangular metal plate and has a number of slots 621 formed therein. The slots 621 may be appropriately set so that the microwave can be efficiently radiated. For example, the slots 621 are arranged at predetermined intervals in the radial direction from the center of the triangle toward the periphery and in the circumferential direction. Further, adjacent slots 621 are formed so as to intersect with each other or be orthogonal to each other.

The microwave-transmitting plate 61, which is made of a dielectric material, for example, ceramics such as alumina or quartz, has a function of transmitting the microwave which is transmitted from the coaxial waveguide 65 and radiated from the slots 621 of the slot antenna 62, and supplying the microwave to the processing space S to generate surface wave plasma at a position immediately under the microwave-transmitting plate 61 in the processing space S. The microwave-transmitting plate 61 has a substantially triangular planar shape capable of blocking an opening formed at the side of the ceiling plate 12. An annular concave portion 611 having a tapered surface formed therein to stably generate plasma by concentrating the energy of the microwave is formed in a lower surface of the microwave-transmitting plate 61. The lower surface of the microwave-transmitting plate 61 may have a planar shape.

The slow-wave member 63 is installed on the slot antenna 62 and is made of a dielectric material having a dielectric constant higher than a vacuum, for example, ceramics such as alumina. The slow-wave member 63 is provided to shorten the wavelength of the microwave and has a substantially triangular planar shape corresponding to the microwave-transmitting plate 61 and the slot antenna 62.

The cooling jacket 64 is installed on the slow-wave member 63 and includes a refrigerant flow path 641 formed therein. The cooling jacket 64 is configured to cool the antenna part 60 by circulating a refrigerant through the refrigerant flow path 641.

The microwave generated by the microwave generation part 69 is radiated from the slots 621 of the slot antenna 62 via the waveguide 67, the mode converter 66, the coaxial waveguide 65 and the slow-wave member 63 and is supplied through the microwave-transmitting plate 61 into the processing space S defined under the microwave-transmitting plate 61.

The processing gas supply mechanism 50 includes a processing gas supply source 51, a pipe 52 extending from the processing gas supply source 51, a peripheral-side gas supply path 53 formed in the periphery of a portion of the ceiling plate 12 supporting the microwave-transmitting plate 61, and a central-side gas supply path 54 formed in the center of the portion of the ceiling plate 12 supporting the microwave-transmitting plate 61.

The peripheral-side gas supply path 53 is opened in the upper surface of the ceiling plate 12. A leading end of the peripheral-side gas supply path 53 forms a gas discharge port 53a through which a processing gas is discharged from the peripheral side into the processing space S. The central-side gas supply path 54 is also opened in the upper surface of the ceiling plate 12. A leading end of the central-side gas supply path 54 forms a gas discharge port 54a through which the processing gas is discharged from the central side into the processing space S. The peripheral-side gas supply path 53 is formed at a plurality of locations, for example, two locations, at intervals so that the processing gas can be discharged from the plurality of locations at the peripheral side. The pipe 52 is connected to the openings of the peripheral-side gas supply path 53 and the central-side gas supply path 54. A flow rate controller such as a mass flow controller and an opening/closing valve (all not shown) are installed in the pipe 52. When a plurality of processing gases is used, a plurality of processing gas supply sources 51 may be installed corresponding to the number of processing gases. Pipes may be respectively connected to the plurality of processing gas supply sources 51. A flow rate controller and an opening/closing valve may be installed in each of the pipes Examples of the processing gas may include a plasma generation gas such as an Ar gas, a reaction gas reacting with a precursor gas, for example, a nitriding gas such as a $NH_3$ gas or a $N_2$ gas.

When the processing gas is supplied into the processing space S into which the microwave is supplied, microwave plasma is generated and active species of the nitriding gas, for example, $NH_3$ radicals ($NH_3^*$), is generated as the reaction gas. As the wafer W mounted on the rotary table 2 passes through the processing space S, the wafer W is subjected to processing by the active species. Alternatively, instead of the nitriding gas, a reducing gas such as a $H_2$ gas may be supplied as the reactive gas to perform a reduction process with hydrogen radicals.

In some embodiments, a separate gas supply line may be provided to supply the plasma generation gas as the processing gas to a position immediately under the microwave-transmitting plate 61.

In some embodiments, in the microwave plasma processing apparatuses 100A, 100B and 100C, the same reaction gas may be supplied to perform the same process. For example, a nitriding gas may be supplied to perform a plasma nitriding process as the same process. Alternatively, the same reaction gas may be supplied to perform different processes. For example, a nitriding process may be performed in the microwave plasma processing apparatus 100B positioned at the central side, and other processes such as a reducing process may be performed in the microwave plasma processing apparatuses 100A and 100C.

As shown in FIG. 1, the exhaust mechanism 57 for exhausting the processing space in the reaction region R2 exhausts the interior of the processing container 11 through four exhaust ports 190A, 190B, 190C and 190D provided at regular intervals in the outer edge portion of the bottom of the container body 13 of the processing container 11.

Figure 5:
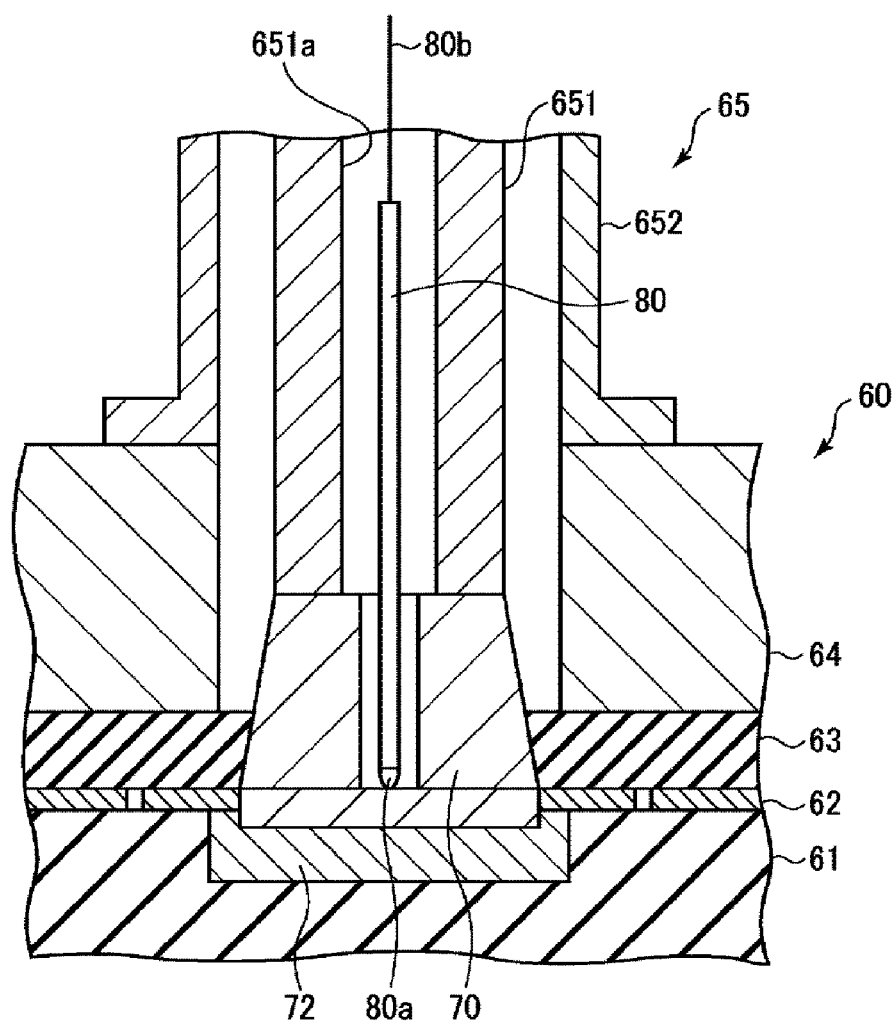
FIG. 5 is a sectional view showing arrangement positions of a coaxial waveguide, a connector, a cap and a thermocouple of the microwave plasma processing apparatus of FIG. 4.

As shown in an enlarged scale in FIG. 5, a hole 651a is vertically formed in the inner conductor 651 and the connector 70 of the coaxial waveguide 65. A thermocouple 80 serving as a temperature detector is inserted into the hole 651a. A temperature measurement part 80a of the thermocouple 80 is positioned in a portion corresponding to the connector 70 and the cap 72, which are near the slot antenna 62. In some embodiments, the thermocouple 80 may be installed in a microwave propagation path leading to the slot antenna 62, specifically at another position of the inner conductor 651 of the coaxial waveguide 65 inside the antenna part 60. In some embodiments, the thermocouple 80 may be installed at a plurality of locations in the microwave propagation path. A sheathed thermocouple, an optical fiber type thermocouple or the like can be suitably used as the thermocouple 80 serving as the temperature detector.

A signal line 80b of the thermocouple 80 is connected to an abnormality detection part 81. A temperature signal obtained by the thermocouple 80 is inputted to the abnormality detection part 81. The abnormality detection part 81 monitors the temperature signal of the thermocouple 80 and determines the presence or absence of abnormality based on the temperature signal. Specifically, a predetermined detection temperature threshold value is set in the abnormality detection part 81. If a detected temperature exceeds the predetermined threshold value, the abnormality detection part 81 determines that an abnormality has occurred, and issues a command for ensuring the safety of the members in the microwave propagation path. In this embodiment, a first threshold value for a predetermined temperature and a second threshold value higher than the first threshold value are set in the abnormality detection part 81. When the temperature signal provided from the thermocouple 80 exceeds the first threshold value, the abnormality detection part 81 outputs a warning generation signal to a warning generation part 82 so that the warning generation part 82 issues a warning. When the temperature signal provided from the thermocouple 80 exceeds the second threshold value, the abnormality detection part 81 outputs an alarm generation signal to the alarm generation part 83 so that the alarm generation part 83 issues an alarm. Further, the abnormality detection part 81 outputs a plasma generation stop signal to the overall control part 8 so that the overall control part 8 performs a plasma stop operation (recipe abort). For example, a step in the process recipe is changed to a step in which plasma is not generated.

Further, the abnormality detection part 81 has a function of: receiving signals of a traveling wave and a reflection wave from the detector 85, which is composed of a directional coupler and is capable of detecting the traveling wave and the reflection wave; receiving a position of the tuner 68 (for example, a slug position in case of a slug tuner) from the tuner 68; detecting a ratio of the reflection wave to the traveling wave and the position of the tuner 68 (for example, the slug position in the case of a slug tuner) as detection/adjustment parameters; and outputting a plasma generation stop signal to the overall control part 8 when respective parameter values exceed a threshold value. Such a function is similar to the related art.

<Operation of Film Forming Apparatus>

Next, the operation of the film forming apparatus configured as above will be described.

In performing the PE-ALD film forming process using the film forming apparatus, first, the gate valve of the loading/unloading port 101 is opened and a plurality of wafers W is loaded into the processing container 11 by an external transfer mechanism. The plurality of wafers W is mounted on the wafer mounting regions 21 of the rotary table 2, respectively.

The wafers W are transferred while intermittently rotating the rotary table 2 and are mounted on the respective wafer mounting regions 21. Upon completing the mounting of the wafers W, the transfer mechanism is retracted and the gate valve of the loading/unloading port 101 is closed. At this time, the interior of the processing container 11 is evacuated to have a predetermined pressure by the exhaust mechanism 57 in advance. For example, an Ar gas is supplied as a separation gas.

Subsequently, the wafers W mounted on the rotary table 2 are heated at a predetermined set temperature by the heater 46 based on a detected value of a temperature sensor (not shown). A precursor gas is supplied into the adsorption region R1 inside the processing container 11, a processing gas including a reaction gas is supplied into the microwave plasma processing apparatuses 100A, 100B and 100C provided in the regions R2-1, R2-2 and R2-3 of the reaction region R2, and a microwave is supplied from the microwave plasma sources 6A to 6C. The rotary table 2 is rotated clockwise at a predetermined speed so that the adsorption of the precursor gas and a plasma-based reaction process are alternately repeated with respect to the wafers W. Thus, a predetermined film is formed by PE-ALD.

For example, when a Si precursor gas such as dichlorosilane (DCS; $SiH_2Cl_2$) is used as the precursor gas and a nitriding gas such as a $NH_3$ gas is used as the reaction gas, the adsorption of Si precursor and the reaction process based on active species of plasmarized nitriding gas are alternately repeated to form a SiN film.

At this time, as described above, in the microwave plasma processing apparatuses 100A, 100B and 100C, the same reaction gas may be supplied to perform the same process. For example, a nitriding gas may be supplied to perform a plasma nitriding process as the same process. Alternatively, the same reaction gas may be supplied to perform different processes.

For example, a nitriding process may be performed in the microwave plasma processing apparatus 100B positioned at the central side and another process such as a reducing process may be performed in the microwave plasma processing apparatuses 100A and 100C. In addition to the reaction gas, a plasma generation gas such as an Ar gas may be used as the processing gas. A similar process is performed in these apparatuses regardless of which processing gas is used.

Hereinafter, the operation of the microwave plasma processing apparatus 100A shown in FIG. 4 will be described on behalf of the microwave plasma processing apparatuses 100A, 100B and 100C.

The processing gas including the reaction gas is introduced into the processing space S from the processing gas supply source 51 of the processing gas supply mechanism 50 via the pipe 52, the peripheral-side gas supply path 53 and the central-side gas supply path 54, and a microwave is introduced into the processing space S to generate microwave plasma.

More specifically, a microwave of predetermined power generated by the microwave generation part 69 propagates through the waveguide 67 in a TE mode. The TE mode of the microwave is converted to a TEM mode by the mode converter 66. The microwave of the TEM mode propagates through the coaxial waveguide 65 and is radiated into the processing space S via the slow-wave member 63, the slots 621 of the slot antenna 62, and the microwave-transmitting plate 61.

The microwave spreads as a surface wave only in a region immediately under the microwave-transmitting plate 61 to generate microwave plasma as surface wave plasma. Then, the plasma diffuses downward to become plasma with high electron density and low electron temperature in the arrangement region of the wafers W.

At this time, if an ignition failure occurs in the microwave plasma processing apparatuses 100A, 100B and 100C, damage to the members constituting the antenna part 60, damage to the wafers being processed, and downtime for restoring the apparatuses may occur. Therefore, there is a need for safety measures to monitor the ignition failure.

The microwave plasma processing apparatuses 100A, 100B and 100C of the present embodiment are mounted in the same film forming apparatus as that of the above-described related art and are arranged adjacent each other. This may cause a problem of the occurrence of erroneous detection, and makes it difficult to apply a light emitting sensor as a safety measure to monitor an ignition failure due to problems such as a space restrictions and the size of carbon wire heaters. Accordingly, no light emitting sensor is used.

Conventionally, as the safety measure in the case of using no light emitting sensor, a threshold value of a parameter (for example, a ratio of a reflection wave to a travelling wave, a position of a tuner that performs impedance matching, etc.) detected and adjusted inside a microwave plasma source is merely monitored. However, when no light emitting sensor is used only with monitoring of the threshold value, in the case where unexpected matching occurs in an antenna part or micro-discharge occurs in a microwave propagation path, an abnormality may not appear in a parameter detected and adjusted inside the microwave plasma source, which makes it difficult to find an ignition failure beforehand.

Therefore, as a result of investigations and studies by the present inventors, it has been found that an abnormality does not appear only when monitoring the threshold value, matching of a microwave at an unexpected place in the antenna part and micro-discharge in the microwave propagation path leading to the slot antenna 62 increases the resistance at a connection portion of the members of the microwave propagation path, which raises the temperature. Due to such a temperature rise, abnormal discharge is likely to occur, which results in an ignition failure.

In view of the forgoing, the temperature rise in the microwave propagation path can be regarded as an indicator of ignition failure. Thus, the ignition failure can be predicted in advance by detecting the temperature of the microwave propagation path leading to the slot antenna 62.

In addition, it has been found that a sector at which the temperature is likely to rise is portions corresponding to the antenna part 60 of the microwave propagation path, namely portions of the inner conductor 651 of the coaxial waveguide 65, the connector 70 and the cap 72 under the connector 70, specifically in the vicinity of the connector 70 and the cap 72, more specifically in the vicinity of the cap 72. It has also been found that, in the case where the microwave plasma processing apparatuses are applied to a long-time process like the ALD process of this embodiment, when unexpected matching occurs in the antenna part or micro-discharge occurs, a high-temperature state continues and abnormal discharge occurs, which results in an ignition failure.

Therefore, in the present embodiment, the thermocouple 80 serving as a temperature detector is inserted into the hole 651a formed in the inner conductor 651 of the coaxial waveguide 65 and the connector 70, the temperature measurement part 80a is located at a portion corresponding to the connector 70 and the cap 72 which is in the vicinity of the slot antenna 62 to detect the temperature of the portion, and the temperature signal is inputted to the abnormality detection part 81. The abnormality detection part 81 determines the presence or absence of abnormality based on the temperature signal. Specifically, a predetermined threshold value of the temperature is set in the abnormality detection part 81. If the temperature exceeds the predetermined threshold value, the abnormality detection part 81 issues a command for ensuring safety. In this embodiment, a first threshold value of a predetermined temperature and a second threshold value higher than the first threshold value are set in the abnormality detection part 81. If the temperature signal provided from the thermocouple 80 exceeds the first threshold value, the abnormality detection part 81 outputs a warning generation signal to the warning generation part 82 so that the warning generation part 82 issues a warning. If the temperature signal provided from the thermocouple 80 exceeds the second threshold value, the abnormality detection part 81 outputs an alarm generation signal to the alarm generation part 83 so that the alarm generation part 83 issues an alarm. Further, the abnormality detection part 81 outputs a plasma generation stop signal to the overall control part 8 so that the overall control part 8 stops the generation of plasma. In the step of issuing the warning when the temperature exceeds the first threshold value, the process is continued and the maintenance such as replacement of the members is performed after the completion of the process.

As described above, the present inventors focused on the fact that the temperature of the members of the microwave propagation path rises when matching occurs at unexpected places due to contact failure or the like, or light discharge occurs. Thus, it is possible to prevent an ignition failure from being generated in advance by monitoring the temperature of the microwave propagation path, specifically the temperature of the members of the antenna section 60, which are more likely to rise in temperature, more specifically the temperature in the vicinity of the connector 70 and the cap 72, which are likely to rise in temperature.

As has been done other techniques, the abnormality detection unit 81 detects the ratio of the travelling wave to the refection wave based on the detected value of the detector 85 and the position of the tuner 68 (for example, a slug position in case of a slug tuner) as detection/adjustment parameters, and outputs the plasma generation stop signal to the overall control part 8 when the parameter values exceed a threshold value. As a result, it is possible to take appropriate safety measures as in the other techniques.

Experimental Example

Next, experiment examples will be described.

Here, as in the above-described embodiment, in a film forming apparatus in which three microwave plasma processing apparatuses are provided adjacent each other, plasma was actually generated by the three microwave plasma processing apparatuses and an experiment was conducted to measure the temperature of a microwave propagation path. Conditions at that time were as follows.

1. Specifications of Processing Container
Temperature of processing container: 475 degrees C.
Pressure of processing container: 2 Torr
2. Specifications of Antenna Part
Temperature of antenna part: 80 degrees C. (chiller control)
Temperature of water cooling in inner conductor: 25 degrees C. (room temperature)
Pressure of coaxial waveguide: atmospheric pressure
3. Process Conditions
Type of gas used: $Ar/NH_3/H_2$
Microwave power: 2.5 kW, 3 kW
4. Temperature Monitoring Threshold
Abnormality warning (first threshold): over 150 degrees C., 2 sec or more
Abnormality alarm (second threshold): over 300 degrees C., 2 sec or more Under these conditions, plasma was generated by the three microwave plasma processing apparatuses and temperatures of cap portions of antenna parts Ant-1, Ant-2 and Ant-3 were measured. The results are shown in FIG. 6.

Figure 6:
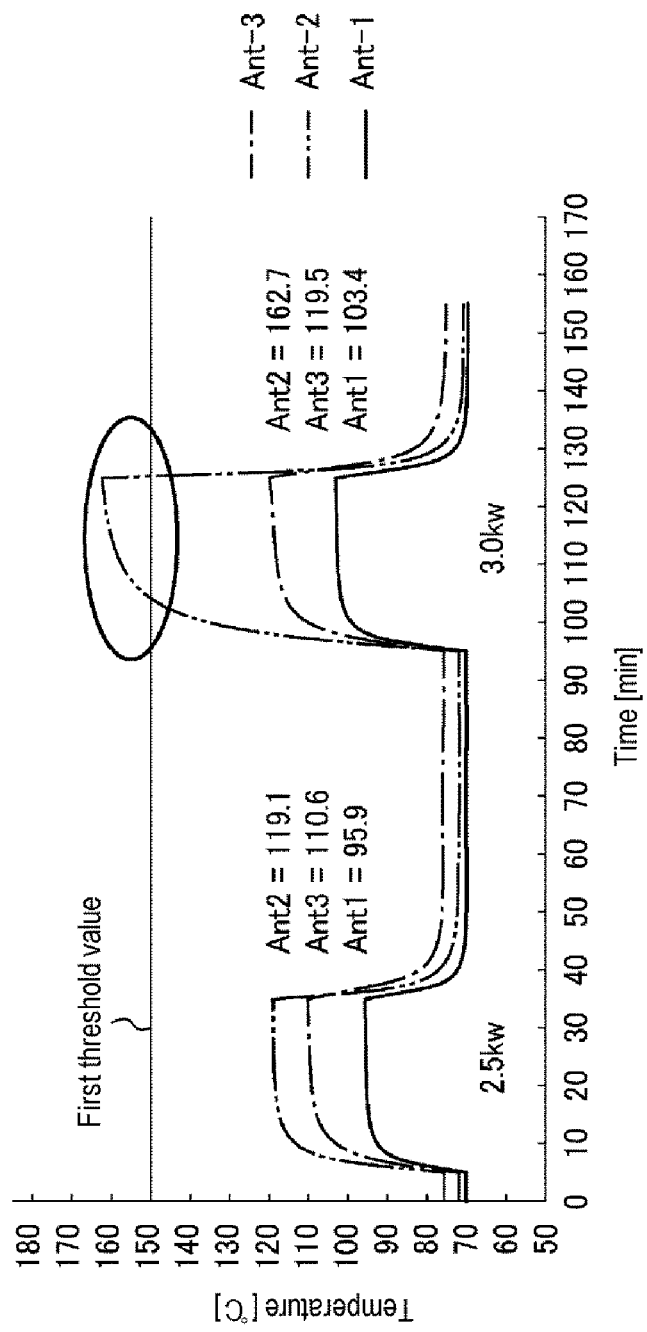
FIG. 6 is a view showing a temperature change in the vicinity of a connector and a cap installed under a coaxial waveguide in an experimental example.

As shown in FIG. 6, when the microwave power is 2.5 kW, the temperature of the cap portion in any of the antenna parts was 150 degrees C. or less, which is a warning threshold value. However, when the microwave power is 3 kW, the temperature of the cap portion in the antenna part Ant-2 was 162.7 degrees C. exceeding 150 degrees C. As a result of continuing to use the antenna part Ant-2, abnormal discharge occurred in a coaxial waveguide at a later date, resulting in an ignition failure. The present inventors have disassembled and checked the antenna part Ant-2 and have found that discharge traces were observed in such a manner to face each other at the outer side of the inner conductor and the inner side of the outer conductor in the coaxial waveguide.

From these results, it was confirmed that an ignition failure can be predicted in advance by measuring the temperature of the microwave propagation path, specifically the temperature of the cap portion under the coaxial waveguide.

<Other Applications>

Although the embodiments of the present disclosure have been described above, the present disclosure is not limited to the above embodiments but various modifications can be made without departing from the spirit of the present disclosure.

For example, while in the above-described embodiments, descriptions have been made on the case where the present disclosure is applied to a plurality of microwave plasma processing apparatuses provided in a PE-ALD film forming apparatus, the present disclosure is not limited thereto but may be applied to other microwave plasma processing apparatuses.

In addition, while in the above-described embodiments, a thermocouple has been described to be used as a temperature detector, the temperature detector is not limited thereto but may be any temperature sensor known in the art, such as an optical fiber sensor. However, in a case where the temperature detector is covered with metal, such as a sheathed thermocouple, care should be taken not to interfere with microwave propagation by installing the temperature detector in a closed space. There is a case where a portion to be temperature-measured is heated to 100 to 1,000 degrees C. In this case, a material having heat resistance adapted for the heating temperature may be used as a material of the temperature detector.

Furthermore, while in the above-described embodiments, the temperature detector has been described to be installed at a portion corresponding to the connector and the cap, the present disclosure is not limited thereto. For example, the temperature detector may be installed at another position in the coaxial waveguide. However, it is desirable that a temperature detection position is a position away from a water cooling portion. In a case where an abnormal discharge risk arises in the coaxial waveguide due to the configuration of the antenna part, the temperature detection position may be on the microwave propagation path other than the coaxial waveguide.

According to the present disclosure in some embodiments, in a microwave propagation path leading to a slot antenna, it is possible to detect the rise in temperature when matching or light discharge at an unexpected place due to contact failure or the like, thus preventing an ignition failure in advance.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A plasma processing method for performing a plasma process by a microwave plasma processing apparatus,
wherein the microwave plasma processing apparatus includes:
a processing container having a processing space defined therein and in which a target substrate is processed;
a microwave generation part configured to generate a microwave;
a waveguide path including a coaxial waveguide and configured to propagate the microwave generated by the microwave generation part therethrough;
an antenna part including a slot antenna and a microwave-transmitting plate, the slot antenna having a predetermined pattern of slots formed therein and being configured to radiate the microwave propagating through the waveguide path into the processing space, and the microwave-transmitting plate being made of a dielectric material and being configured to transmit the microwave radiated from the slots therethrough and supply the microwave into the processing space;

a gas supply mechanism configured to supply a plasma processing gas into the processing space; and an exhaust mechanism configured to exhaust the processing space, the method comprising:

when a microwave plasma is generated by radiating the microwave into the processing space via the waveguide path and the antenna part while supplying the plasma processing gas into the processing space, detecting a temperature at a position in a vicinity of the slot antenna within the coaxial waveguide of a microwave propagation path leading to the slot antenna; and detecting an abnormality in the microwave propagation path based on the detected temperature so as to predict a plasma ignition failure in advance.

2. The plasma processing method of claim 1, wherein the waveguide path of the microwave plasma processing apparatus includes a waveguide configured to propagate the microwave from the microwave generation part therethrough, and a connection portion that connects the coaxial waveguide and the waveguide, wherein a connector connected to the slot antenna and a cap covering a lower portion of the connector are installed under an inner conductor of the coaxial waveguide.

3. The plasma processing method of claim 2, wherein, in the detecting a temperature, the temperature is detected at a position corresponding to the connector or the cap.

4. The plasma processing method of claim 1, further comprising: when the detected temperature exceeds a predetermined threshold value, determining that an abnormality occurs in the microwave propagation path; and ensuring safety of members in the microwave propagation path.

5. The plasma processing method of claim 4, wherein a first threshold value and a second threshold value higher than the first threshold value are set as the predetermined threshold value, further comprising:

issuing a warning when the detected temperature exceeds the first threshold value; and issuing an alarm and stopping a plasma generation when the detected temperature exceeds the second threshold value.

* * * * *